United States Patent [19]

Nguyen et al.

[11] Patent Number: 4,897,364

[45] Date of Patent: Jan. 30, 1990

[54] METHOD FOR LOCOS ISOLATION USING A FRAMED OXIDATION MASK AND A POLYSILICON BUFFER LAYER

[75] Inventors: Bich-Yen Nguyen; Philip J. Tobin; Shih-Wei Sun; Michael Woo, all of Austin, Tex.

[73] Assignee: Motorola, Inc., Schaumburg, Ill.

[21] Appl. No.: 315,866

[22] Filed: Feb. 27, 1989

[51] Int. Cl.$^4$ .............................................. H01L 21/76
[52] U.S. Cl. .......................................... 437/69; 437/70
[58] Field of Search ........................ 437/69, 70, 72, 73; 156/643

[56] References Cited

U.S. PATENT DOCUMENTS

| | | | |
|---|---|---|---|
| 4,376,336 | 3/1983 | Endo et al. | 437/70 |
| 4,407,696 | 10/1983 | Han et al. | 156/653 |
| 4,583,281 | 4/1986 | Ghezzo et al. | 156/643 X |
| 4,755,477 | 7/1988 | Chao | 437/36 |
| 4,758,530 | 7/1988 | Schubert | 437/69 |
| 4,812,418 | 3/1989 | Pfiester et al. | 437/69 |

FOREIGN PATENT DOCUMENTS

| | | | |
|---|---|---|---|
| 0111774 | 6/1984 | European Pat. Off. | 437/70 |
| 0146895 | 7/1985 | European Pat. Off. | 437/70 |
| 59-224141 | 12/1984 | Japan | 437/70 |

OTHER PUBLICATIONS

Martin, "Spacer for Improved Oxidation Profile", Xerox Disclosure Journal, vol. 12, No. 5 (Sep./Oct. 1987), pp. 251-253.

Ghezzo et al., Laterally Sealed LOCOS Isolation, Jun. 1987, pp. 1475-1479, Journal of the Electrochemical Society: Solid State Science and Technology.

Mizuno et al., Oxidation Rate Reduction in the Submicrometer LOCOS Process, Nov., 1987, pp. 2255-2259, IEEE Transactions on Electron Devices, vol. ED34, No. 11.

Minegishi et al., A New Self-Aligned Framed Mask Method for Selective Oxidation, 1981, pp. 55-61, Japanese Journal of Applied Physics, vol. 20, supplement 20-4.

Primary Examiner—Olik Chaudhuri
Attorney, Agent, or Firm—John A. Fisher

[57] ABSTRACT

An improved LOCOS device isolation method for forming a field oxide is disclosed having the advantage of controllable and uniform sidewall framing of a nutride oxidation mask. This advantage is achieved by the use of a polysilicon layer overlying a nitride mask with the polysilicon providing an etching endpoint during the anisotropic etching used for sidewall formation. In one embodiment of the invention a silicon substrate is provided having a pad oxide formed on its surface and a first polysilicon stress-relief buffer layer formed overlying the pad oxide. A first nitride layer, to be used for oxidation masking during field oxide growth, is deposited overlying the first polysilicon layer. Next, a second polysilicon, etch-resistant buffer layer is deposited overlying the first nitride layer.

The first nitride layer and second polysilicon layer are patterned by conventional lithography while the first polysilicon and pad oxide layers remained unpatterned. A second nitride layer is deposited overlying the patterned second polysilicon layer and exposed regions of the first polysilicon layer. Sidewalls are formed on the edges of the patterned first nitride and second polysilicon layers by anisotropically etching the second nitride layer using the first and second polysilicon layers as etching endpoints. Finally, the field oxide is grown by conventional methods. The grown field oxide exhibits reduced bird's beak length, and the resulting field separation is not limited by optical lithography resolution.

10 Claims, 2 Drawing Sheets

METHOD FOR LOCOS ISOLATION USING A FRAMED OXIDATION MASK AND A POLYSILICON BUFFER LAYER

BACKGROUND OF THE INVENTION

This invention relates generally to an isolation process for semiconductor devices, and more specifically to an improved LOCOS isolation process using a framed oxidation mask and a polycrystalline silicon (polysilicon) buffer in the manufacture of semiconductor devices.

In the manufacture of semiconductor devices, typically thousands of individual transistor devices are formed upon a single silicon substrate. These devices are interconnected to form complex circuits, also known as integrated circuits, as required for a particular circuit design. Because the transistors are formed within the same substrate, the transistors must be electrically isolated except as interconnected according to the circuit design; otherwise, undesired electrical connections between the transistors would cause circuit shorts. Several methods exist for device isolation and vary with the type of device being manufactured. One device isolation method widely used in the manufacture of insulated gate field effect transistors (IGFETs) is the well-known local oxidation of silicon, or LOCOS, process.

In a typical LOCOS process a thin silicon oxide layer, or pad oxide, is grown over a silicon substrate, and then a silicon nitride layer is deposited over the silicon oxide layer. Next, the pad oxide and nitride layers are patterned by known lithographic techniques to partially expose the substrate. The exposed regions of the substrate are known as the field regions. Regions of the substrate still covered with the pad oxide and nitride are known as the active regions and will eventually contain the transistors for the integrated circuit. A thick silicon oxide insulator, or field oxide, is grown in the field regions of the silicon substrate by placing the substrate in a steam ambient, typically at a temperature in the range of 900°–1100° C., for an extended time. The steam reacts with the exposed silicon to form silicon oxide. The thick field oxide provides electrical isolation by increasing the threshold voltage in the field region, thereby preventing the formation of a conductive path in the surface of the underlying silicon substrate. The active regions remain unoxidized and covered by nitride during the field oxide growth. Finally, the nitride and pad oxide are removed. Transistors are then formed by additional processing in the active region.

The continuing trend in integrated circuit design is to further increase the packing density of transistor devices on the silicon substrate. This is important for increasing both transistor performance and the quantity of the devices that can be placed upon a given surface area of silicon. The need for increased device density is most crucial in the manufacture of memory circuits, especially random access memories (RAMs), because of the use of large memory arrays formed by the replication of tightly-packed groups of devices. Device density, and hence memory density, can be increased by shrinking all or some of the dimensions of the these tightly-packed device groups. One approach for increasing the packing density is the reduction of the lateral separation used between devices for electrical isolation. Even with the device sizes unchanged, for example devices having constant effective widths, a reduction in the device separation distance can significantly increase the packing density on an integrated circuit.

However, there are several limitations to the reduction of the device isolation distance. In the conventional LOCOS process, lateral oxidation between the oxidation mask and the substrate results in a tapering of the grown field oxide at the active region boundaries which is known as a bird's beak. This bird's beak partially penetrates into the active region of the substrate and reduces the size of the devices that can be formed in the active region. This penetration is also known as field encroachment. That portion of the field oxide thinned by the formation of the bird's beak does not provide adequate device isolation. Furthermore, the length of the bird's beak sets a minimum limit on the degree to which the device isolation distance, or field separation, can be decreased. Indeed, conventional LOCOS is not even viable for current sub-micron memories because of its excessive bird's beak length.

One approach used to reduce the bird's beak length is the known polysilicon-buffered LOCOS, or PBL, process in which a polysilicon buffer layer is deposited between the pad oxide and nitride of the conventional LOCOS process. Since it is known that oxygen diffusion through the pad oxide to the silicon substrate is a major contributor to bird's beak formation, the addition of the polysilicon buffer layer reduces the lateral field encroachment by reducing the degree of oxygen diffusion through the pad oxide.

Another limitation on the reduction of field separation is the acceptable range of thicknesses for the nitride layer. Even though an increase in the nitride layer thickness reduces the bird's beak length due to increased nitride layer rigidity, the thicker nitride increases stress on the silicon substrate. It is desirable to minimize substrate stress to avoid creating disruptions in the substrate surface such as crystal dislocations which promote junction leakage and low junction breakdown voltage at the active region edges. A deposited nitride exhibits considerable tensile stress which is transferred to the substrate and can damage the substrate surface during field oxide growth.

Buffer layers between the nitride layer and the silicon substrate such as the pad oxide and the polysilicon buffer of the PBL process reduce, but do not eliminate, the effects of the nitride stress on the substrate. The choice of nitride thickness is a compromise between reducing bird's beak length and reducing substrate stress. An accepted guideline for an optimum compromise is the use of a three-to-one ratio of nitride thickness to the combined buffer thicknesses.

A further limitation on field separation reduction is the resolution limit of current optical lithography equipment. This limitation is most acute in the manufacture of sub-micron devices. When attempting to reduce the field separation below one-half of a micron, as in current high-density RAM manufacture, it is impossible to define the field region by lithography because the lithography equipment's lower resolution limit is greater than the desired field separation.

To overcome this lithography limitation, sidewalls are added to the edges of the patterned nitride and buffer layers (adding sidewalls is also known as framing the nitride mask). These sidewalls are formed by depositing a second nitride layer over the patterned first nitride layer. The second nitride layer is then etched anisotropically to form sidewalls. Because the sidewalls are formed without the use of a patterned mask, the field separation can be reduced below the resolution limits of optical lithography. Another advantage of the sidewalls is the prevention of oxygen diffusion into the edges of the pad oxide or other buffer layers which reduces bird's beak formation.

A problem with this sidewall formation method, however, is poor sidewall uniformity. The height of the first nitride layer's top surface determines the etched sidewall's dimensions, such as height and width at the sidewall base. Yet, because some of the first nitride layer is removed during the sidewall etching, it is difficult to maintain uniformity in the sidewall dimensions. Also, the control of the etching is difficult since the first nitride and second nitride layers have essentially the same etch selectivities.

In another sidewall formation method a low temperature oxide (LTO) layer is deposited onto the first nitride layer. Both the first nitride and LTO layers are etched to be self-aligned. In this method the height of the LTO layer's top surface determines the etched sidewall's dimensions. Since the LTO and nitride layers have similar etch selectivities, some of the LTO layer is removed during sidewall formation, and as in the previous method, sidewall uniformity is difficult to achieve. Additionally, the deposited LTO layer is non-uniform which further contributes to poor sidewall dimension uniformity.

In both of the above sidewall formation methods, the steam used during field oxide growth can attack pinholes or small cracks in the first nitride layer and form ammonia. This ammonia can diffuse to the silicon substrate surface and react to form silicon nitride spots. These nitride spots are removed in later processing steps, but small holes can remain in the substrate surface at the former nitride spot locations. These holes, if formed, contribute to poor gate oxide quality in finished devices. Because the first nitride layer is uncovered during field oxide growth, both of the previous sidewall formation methods suffer from this detrimental process known as the Kooi effect.

In the first method, the second nitride layer on top of the first nitride layer is completely etched away exposing the top of the first nitride layer. In the second method the LTO is removed before the field oxide is grown, also exposing the top of the first nitride layer. The LTO is not removed following field oxide growth because the field oxide would be thinned excessively resulting in poor device isolation.

Accordingly, a need existed for a LOCOS isolation process for forming sidewalls providing independent control of the sidewall dimensions, more uniform sidewall etch control, and prevention of damage from the Kooi effect.

It is therefore an object of this invention to provide an improved method for LOCOS isolation.

It is a further object of this invention to provide an improved method for LOCOS isolation which provides more uniform sidewall etch control.

It is still a further object of this invention to provide an improved method for LOCOS isolation that uses conventional processing steps.

Still another object of this invention is to provide an improved method for LOCOS isolation that prevents damage due to the Kooi effect.

A still further object of this invention is to provide an improved method for LOCOS isolation that allows adjustment of the sidewall dimensions independently of the thicknesses of the first nitride layer and underlying buffer layers.

BRIEF SUMMARY OF THE INVENTION

The foregoing and other objects and advantages of the present invention are achieved through a LOCOS isolation method using a framed oxidation mask and a polysilicon buffer layer for sidewall etch control. In accordance with one embodiment of the invention, a silicon substrate is provided having a pad oxide formed on its surface and a first polysilicon stress-relief buffer layer formed overlying the pad oxide. A first nitride layer, to be used for oxidation masking during field oxide growth, is deposited overlying the first polysilicon layer. Next, a second polysilicon, etch-resistant buffer layer is deposited overlying the first nitride layer.

The first nitride layer and second polysilicon layer are patterned by conventional lithography while the first polysilicon and pad oxide layers remained unpatterned. A second nitride layer is deposited overlying the patterned second polysilicon layer and exposed regions of the first polysilicon layer. Sidewalls are formed on the edges of the patterned first nitride and second polysilicon layers by anisotropically etching the second nitride layer using the first and second polysilicon layers as etching endpoints. Finally, the field oxide is grown by conventional methods. The grown field oxide exhibits reduced bird's beak length, and the resulting field separation is not limited by optical lithography resolution.

DETAILED DESCRIPTION OF THE PREFERRED EMBODIMENTS

Figure 1:
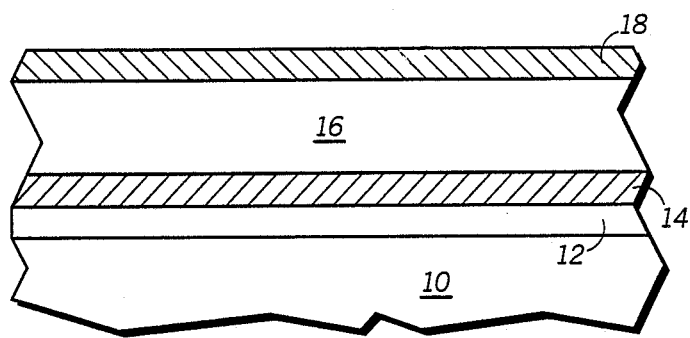
FIGS. 1–6 illustrate process steps, in cross-section, in accordance with one embodiment of the invention.

FIGS. 1–6 illustrate, in cross-section, a process for forming LOCOS isolation in accordance with one embodiment of the invention. Two stress-relief layers, 12 and 14, are formed on a silicon substrate 10, and then an oxidation masking layer 16 and a polysilicon layer 18 are formed overlying stress-relief layers, 12 and 14. Masking layer 16 and polysilicon layer 18 are patterned to define the field regions 26 of the substrate, and sidewalls 30 are formed around the edges 32 of the patterned masking layer 20 with sidewall 30 height set by patterned polysilicon layer 22. A thick field oxide 40 is grown by oxidizing the field regions 26 of the substrate. Sidewalls 46 minimize any bird's beak growth into the active regions 42 of substrate 10.

With reference to FIG. 1, two stress-reducing buffer layers, a pad oxide layer 12 and a polysilicon layer 14, are deposited overlying a silicon substrate 10. Next, an oxidation masking layer 16 of silicon nitride is deposited overlying polysilicon layer 14. Finally, a polysilicon layer 18 is deposited overlying nitride layer 16. All of these steps use conventional processes and are well known in the art.

Figure 2:
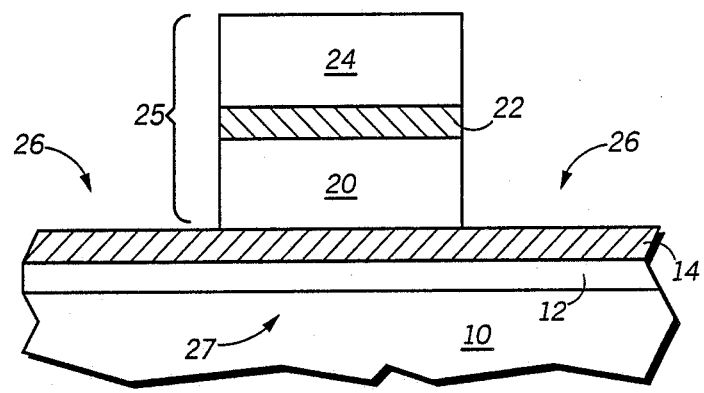

In FIG. 2, a patterned stack 25, consisting of nitride layer 20, polysilicon layer 22, and photoresist layer 24, has been formed by conventional photolithography overlying what will become the active device region 27 of the circuit. The field regions 26, to be oxidized in a later process step, are not covered by stack 25. The oxidation masking nitride layer 20 prevents oxygen diffusion to the underlying region 27 thereof in substrate 10. Following the photolithography steps, photoresist layer 24 is completely removed.

Figure 3:
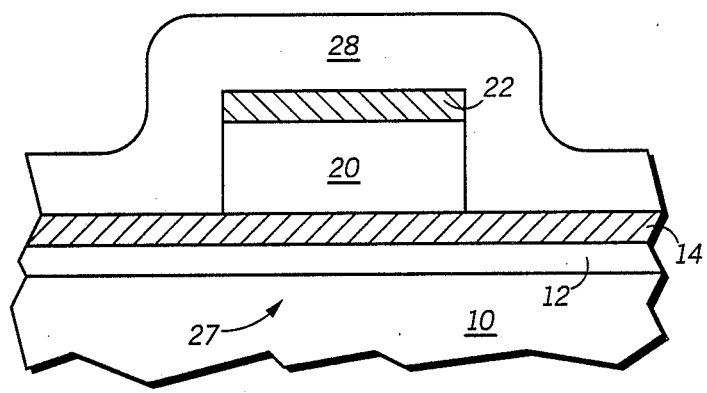

Referring to FIG. 3, a silicon nitride layer 28 is deposited overlying patterned polysilicon layer 22 and the exposed regions of polysilicon layer 14. Nitride layer 28 is then etched by anisotropic etching using a reactive ion etch as is known in the art. Nitride layer 28 also masks oxygen diffusion like nitride layer 20.

Figure 4:
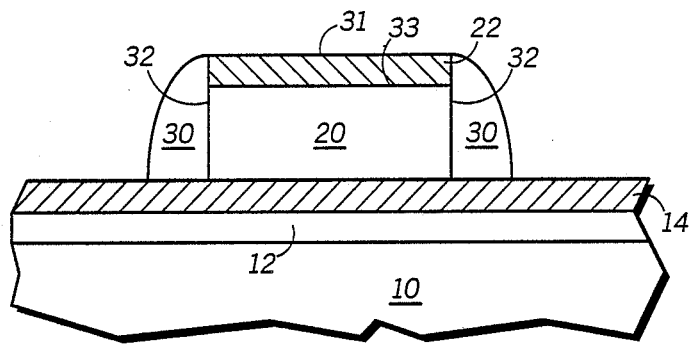

In FIG. 4, nitride sidewalls 30 have been formed around the edges 32 of nitride layer 20 and polysilicon layer 22 by anisotropic etching as discussed above. The etch selectivity of the chemistry used in this etching is substantially selective towards nitride relative to polysilicon. Therefore, polysilicon layers 22 and 14 act as etching endpoints during the formation of nitride sidewalls 30 (polysilicon layers 22 and 14 are nitride-etch resistant layers). Polysilicon layer 14 protects pad oxide layer 12 and substrate 10 from damage caused by anisotropic etching, and polysilicon layer 22 protects the integrity of top surface 33 and of the sidewall 30 to nitride layer 20 interface at the edges 32 from inadvertent etching, thereby preventing the formation of oxygen leakage paths.

Because polysilicon resists the anisotropic nitride etching, the height of the top surface 31 of polysilicon layer 22 determines the height of sidewalls 30. This height can be varied by adjusting the thickness of polysilicon layer 22 as discussed later.

Figure 5:
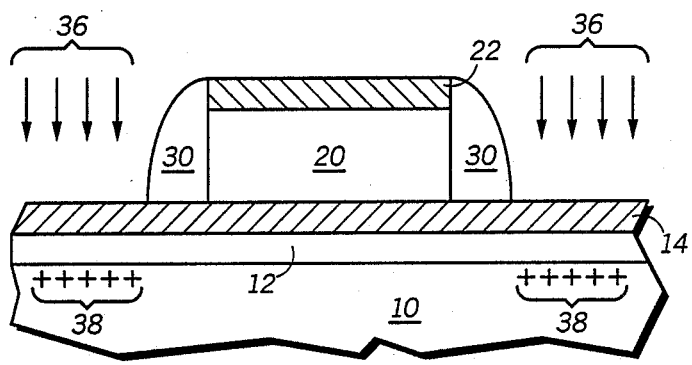

FIG. 5 shows a field channel-stop ion implantation 36 into substrate 10 using the formed sidewalls 30 and patterned polysilicon layer 22 as an implantation mask. The implanted ions 38 in substrate 10 are indicated by "+" symbols. Ions 38 are implanted through both polysilicon layer 14 and pad oxide layer 12, thereby precluding the need and extra processing required for a screen oxide layer as commonly used during ion implantation.

Next, substrate 10 is placed in an oxidizing ambient, usually with steam, at high temperature to form a field oxide. During field oxidation, the regions of polysilicon layer 14 not covered by either oxidation masking layer 20 or sidewalls 30 are oxidized. Also, an oxidizing species diffuses through the oxidized polysilicon layer 14 and pad oxide layer 12 to oxidize silicon substrate 10.

Figure 6:
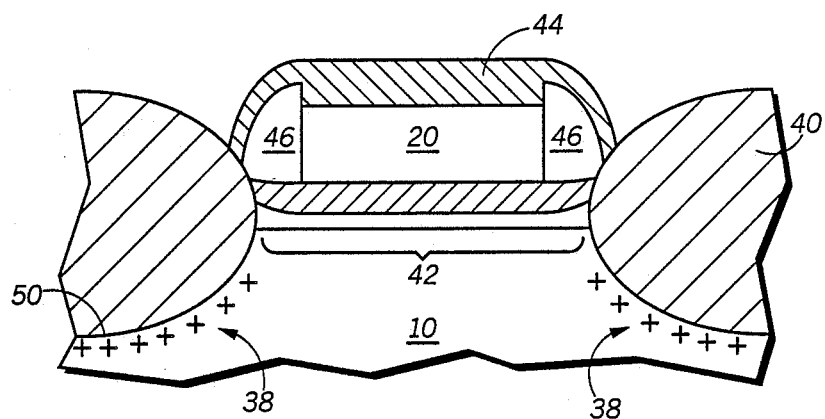

With reference to FIG. 6, a thick field oxide 40 has been grown as described above. The nitride sidewalls 46 have been slightly deformed by the force exerted upward by the growing field oxide, but field oxide 40 encroachment via bird's beak growth into active region 42 has been minimized.

Implanted ions 38 form channel-stop regions underlying field oxide 40 which inhibit the formation of conducting channel regions and thus increase the field threshold voltage. Also, implanted ions 38 do not substantially diffuse into field oxide 40; rather, as field oxide 40 grows and consumes silicon from the surface of substrate 10, implanted ions 38 near the surface, again represented by "+" symbols, diffuse further into substrate 10 as the dopant concentration near the interface 50 between field oxide 40 and substrate 10 increases.

During field oxidation, the exposed surfaces on nitride sidewalls 46 slightly oxidize and polysilicon layer 22 substantially oxidizes to form an oxide layer 44. The portion of oxide layer 44 overlying nitride layer 20 minimizes damage from the Kooi effect by sealing any pinholes or defects on nitride layer 20 to substantially reduce exposure to steam during field oxidation. Without oxide layer 44, steam would attack pinholes or defects in nitride layer 20 thereby initiating the Kooi effect. Oxide layer 44 does not interfere with the practice of the invention.

As a specific, but non-limiting, example which further illustrates preferred embodiments of the invention, field oxide isolation was formed in accordance with the embodiment presented above in FIGS. 1–6. A 10 to 30 nm thermal pad oxide layer was grown on a silicon substrate using $O_2$ and HCl at 900° C. A 50 nm first polysilicon layer was deposited overlying the pad oxide by low pressure chemical vapor deposition (LPCVD) at 625° C. using $SiH_4$. Next, silicon nitride was deposited overlying the first polysilicon layer to a thickness of 100 to 150 nm by LPCVD using $NH_3$ and $SiH_2Cl_2$ at 750° C. A 10 to 30 nm second polysilicon layer was deposited overlying the nitride layer also using $SiH_4$.

The nitride layer and second polysilicon layer were patterned by conventional photolithography, with the second polysilicon layer and nitride layer etched by reactive ion etching as is known. Then, all resist was removed, and a second silicon nitride layer of 75 to 250 nm thickness was deposited overlying the patterned second polysilicon layer and exposed regions of the first polysilicon layer also using $NH_3$ and $SiH_2Cl_2$.

The second nitride layer was etched anisotropically by reactive ion etching using a plasma of $CHF_3$, $C_2F_6$, and He to form sidewalls. The first and second polysilicon layers were substantially resistant to this nitride etching and, thus, acted as etching endpoints for the sidewall formation. The sidewall etching was done using an optical endpoint of about 337 nm or using a timed-etch technique with an overetch time of about 25%. The overetch was used to ensure complete removal of all second nitride except at the sidewalls. Following the second nitride etch, the average second polysilicon layer thickness loss was only 5 to 7.5 nm.

Continuing with the example, impurity ions were implanted into the field region using ion implantation as is well known in the art. Finally, a thick field oxide was grown using a steam ambient at 1000° C. for about 8 hours.

An important advantage of the present invention is the flexibility in sidewall dimension control, especially of the sidewall height and sidewall width, provided by the use of a second polysilicon layer as an etching endpoint. When manufacturing devices with field separation below one-half of a micron, photolithography cannot be used to define the sidewall dimensions due to resolution limitations thereof. This invention provides a means for sidewall formation and reliable control of both sidewall height and width without the use of photolithography.

Referring again to FIG. 4, the height of the top surface 31 of the second polysilicon layer 22 establishes the height of sidewall 30. Further, the thickness of the deposited second nitride layer determines the aspect ratio, defined as the ratio of sidewall height to sidewall width, that will be formed in sidewalls 30. The thickness of polysilicon layer 22 is easily varied by changing deposition conditions to adjust the height of the top surface 31. Increasing the thickness of polysilicon layer 22 increases the height of sidewall 30. Likewise, the thickness of the deposited second nitride layer is easily varied. For example, increasing the thickness of the second nitride layer increases the aspect ratio. By a combination of these two simple adjustments, the sidewall dimensions are readily controlled and varied, and the sidewall dimensions can be optimized based on desired field separation or device characteristics. An additional advantage of this method is that the height of sidewall 30 can be varied independently of the thickness of first nitride layer 20. The independence of the height of sidewall 30 from the thickness of first nitride layer 20 is important because it is known that increasing the nitride thickness increases the stress on silicon substrate 10. Thus, by the method of the present invention, the height of surface 31, and concomitantly the height of sidewall 30, can be increased without an increase in the stress on substrate 10.

Although particular embodiments of the invention have been described in the foregoing description, it will be apparent to one skilled in the art that numerous modifications and variations can be made to the presented embodiments which still fall within the spirit and scope of the invention. For example, other etch-resistant materials such as epitaxially grown silicon, spin-on glass, or silicon carbide could be used instead of polysilicon. Also, the oxidation masking layer could be composed of materials other than nitride such as alumina or an oxynitride. The stress-relieving buffer layers could be formed by either growing or depositing, and the materials used for and the number of the stress-relieving buffer layers could be changed. For example, in some embodiments of the invention, a pad oxide layer is used without an overlying first polysilicon buffer layer. Furthermore, the ion implantation could occur earlier or later in the process than shown in the presented embodiment, and the thicknesses of all of the formed layers could be varied to meet the needs of a specific semiconductor device. Accordingly, it is intended that all such variations and modifications as fall within the scope of the appended claims be included within the invention.

We claim:

1. A method for fabricating a semiconductor device comprising the steps of:
   providing semiconductor substrate;
   forming a buffer layer comprising sequential layers of silicon oxide and polycrystalline silicon overlying said substrate;
   depositing an oxidation masking layer overlying said buffer layer;
   depositing a second layer of polycrystalline silicon overlying said oxidation masking layer;
   patterning said oxidation masking layer and said second layer of polycrystalline silicon;
   depositing a second oxidation masking layer overlying said patterned second layer of polycrystalline silicon and said buffer layer;
   etching said second oxidation masking layer to form sidewalls; and
   oxidizing said semiconductor substrate.

2. The method of claim 1 wherein said step of depositing an oxidation masking layer comprises depositing a nitride layer.

3. The method of claim 1 wherein said step of depositing second oxidation masking layer comprises depositing a nitride layer.

4. The method of claim 1 wherein said step of etching comprises anisotropic etching.

5. A device isolation method comprising the steps of:
   providing a semiconductor substrate;
   forming an oxide layer overlying said substrate;
   depositing a first polysilicon layer overlying said oxide layer;
   depositing an oxidation masking layer overlying said first polysilicon layer;
   depositing a second polysilicon layer overlying said oxidation masking layer;
   patterning said oxidation masking layer and said second polysilicon layer to expose a portion of said first polysilicon layer;
   depositing an etchable, oxidation resistant layer overlying said patterned second polysilicon layer and said exposed first polysilicon layer;
   etching said etchable, oxidation resistant layer to form sidewalls;
   implanting said substrate with a dopant; and
   oxidizing said semiconductor substrate.

6. The method of claim 5 wherein said step of depositing an oxidation masking layer comprises depositing a nitride layer.

7. The method of claim 5 wherein said step of depositing an etchable, oxidation resistant layer comprises depositing a nitride layer.

8. The method of claim 5 wherein said step of etching comprises anisotropic etching.

9. The method of claim 5 wherein said step of implanting comprises implanting through said first polysilicon layer.

10. The method of claim 5 wherein said step of implanting comprises implanting through said oxide layer.

* * * * *